United States Patent
Lange et al.

(10) Patent No.: US 8,232,144 B2
(45) Date of Patent: Jul. 31, 2012

(54) NON-PULL BACK PAD PACKAGE WITH AN ADDITIONAL SOLDER STANDOFF

(75) Inventors: Bernhard P Lange, Freising (DE); Anthony L Coyle, Plano, TX (US); Jeffrey G Holloway, Plano, TX (US)

(73) Assignee: Texas Instuments Incorporated, Dallas, TX (US)

( * ) Notice: Subject to any disclaimer, the term of this patent is extended or adjusted under 35 U.S.C. 154(b) by 407 days.

(21) Appl. No.: 12/560,640

(22) Filed: Sep. 16, 2009

(65) Prior Publication Data
US 2010/0006623 A1   Jan. 14, 2010

Related U.S. Application Data

(62) Division of application No. 11/554,728, filed on Oct. 31, 2006, now Pat. No. 7,608,484.

(51) Int. Cl.
*H01L 21/00* (2006.01)

(52) U.S. Cl. .......... 438/123; 438/613; 257/E21.508

(58) Field of Classification Search .......... 438/123, 438/613; 257/E21.508
See application file for complete search history.

(56) References Cited

U.S. PATENT DOCUMENTS

| | | | | |
|---|---|---|---|---|
| 4,172,907 A | * | 10/1979 | Mones et al. | 438/759 |
| 5,034,345 A | * | 7/1991 | Shirahata | 438/613 |
| 5,436,198 A | * | 7/1995 | Shibata | 438/613 |
| 5,496,770 A | * | 3/1996 | Park | 438/613 |
| 5,527,734 A | * | 6/1996 | van der Putten | 438/613 |
| 5,559,054 A | * | 9/1996 | Adamjee | 438/617 |
| 5,587,337 A | * | 12/1996 | Idaka et al. | 438/613 |
| 5,759,910 A | * | 6/1998 | Mangold et al. | 438/613 |
| 5,924,003 A | * | 7/1999 | Slocum | 438/612 |
| 7,393,773 B2 | * | 7/2008 | Malantonio et al. | 438/613 |
| 8,071,470 B2 | * | 12/2011 | Khor et al. | 438/614 |

* cited by examiner

*Primary Examiner* — David Zarneke
(74) *Attorney, Agent, or Firm* — Steven A. Shaw; W. James Brady; Frederick J. Telecky, Jr.

(57) ABSTRACT

Disclosed herein is a method of manufacturing a semiconductor package with a solder standoff on lead pads that reach to the edge of the package (non-pullback leads). It includes encapsulating a plurality of die on a lead frame strip. The lead frame strip comprises a plurality of package sites, which further comprises a plurality of lead pads and a die pad. The method also includes forming a channel between the lead pads of nearby package sites without singulating the packages. Another step in the method includes disposing solder on the lead pads, the die pad, or the lead pads and the die pads without substantially covering the channel with solder. The manufacturing method further includes singulating the packages.

8 Claims, 7 Drawing Sheets

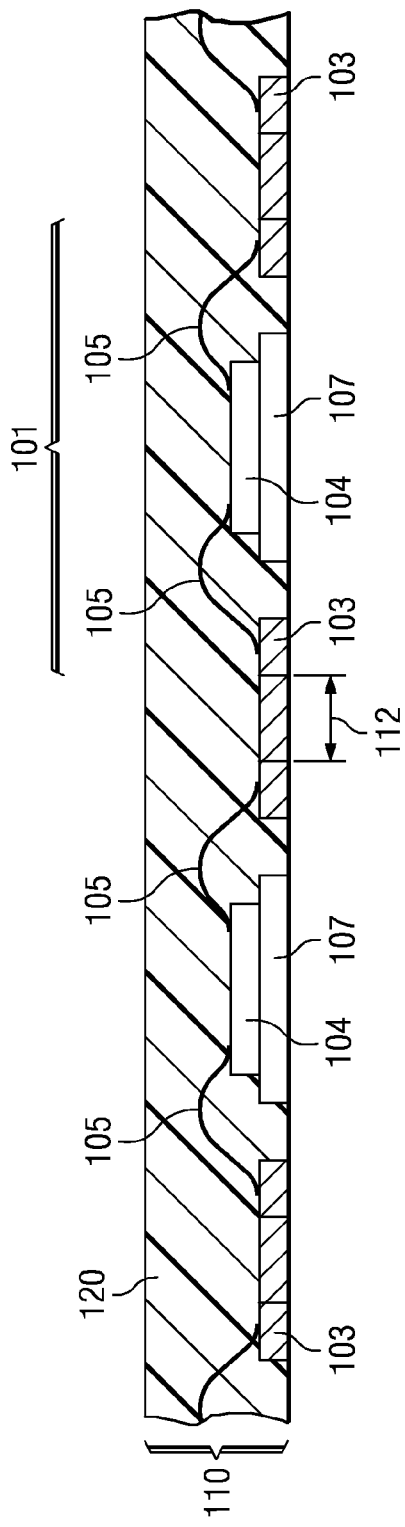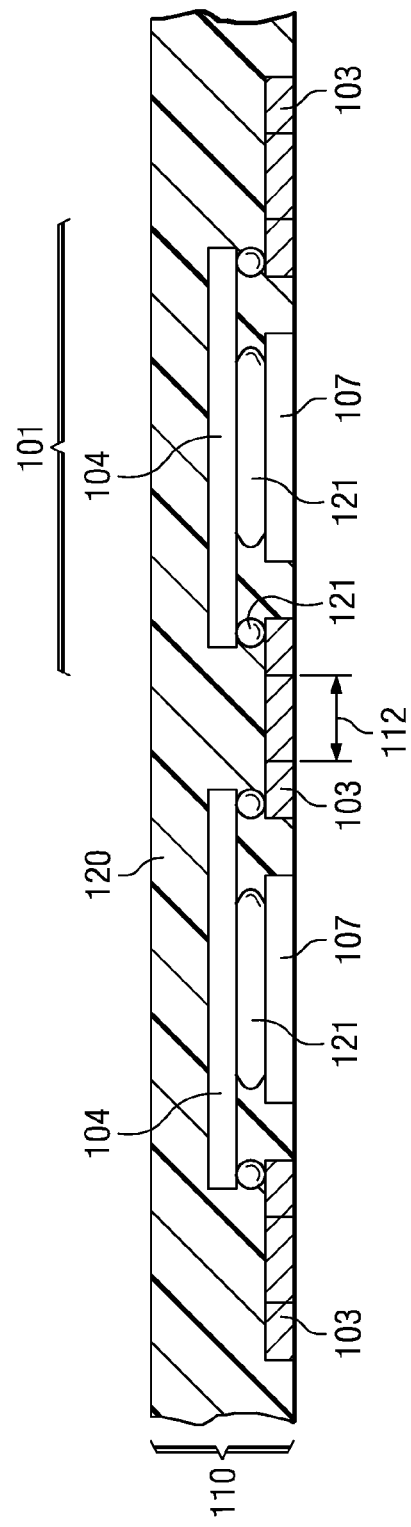

NON-PULL BACK PAD PACKAGE WITH AN ADDITIONAL SOLDER STANDOFF

CROSS-REFERENCE TO RELATED APPLICATIONS

This is a divisional application of Ser. No. 11/554,728 filed Oct. 31, 2006, the contents of which are herein incorporated by reference in its entirety.

STATEMENT REGARDING FEDERALLY SPONSORED RESEARCH OR DEVELOPMENT

Not Applicable

REFERENCE TO A MICROFICHE APPENDIX

Not Applicable

BACKGROUND

An integrated circuit chip may require a carrier or package in order to be integrated into a larger electronic system. One common type of semiconductor package is a Quad Flat Package-No lead (QFN), which does not have leads. A no-lead package results in a smaller footprint on a Printed Circuit Board (PCB), which allows the overall size of the PCB to be reduced. Commonly, a QFN package has a semiconductor die disposed on one side of a lead frame carrier or strip which is then electrically connected to lead pads on the lead frame strip. The strip, die and electrical connections are then encapsulated in a mold compound. The opposite side of the lead frame strip may have exposed pads for electrical connection to a larger electronic system. These packages are usually formed using a lead frame strip capable of carrying a plurality of dies and forming a plurality of QFN packages. Once formed, the QFN packages on the lead frame strip are singulated to create individual packages for end use applications. In some applications the exposed pads of the leadless QFN are supplied with a load (or standoff) of solder attached to each pad. In these cases the exposed pads are positioned so that there is a small amount of encapsulant between them and the edge of the package. When there is little or no solder on the pad surface, the pads are usually constructed so that they reach all of the way to an edge of the package.

SUMMARY

Disclosed herein is a method of manufacturing a semiconductor package with a solder standoff that includes encapsulating a plurality of die on a lead frame strip. The lead frame strip comprises a plurality of package sites, which further comprises a plurality of lead pads and a die pad. The lead pads are loaded with solder and reach to the edges of the package. The method also includes methods for forming a break between the lead pads of nearby package sites without singulating the packages. Another step in the method includes disposing solder on the lead pads, the die pad, or the lead pads and the die pads without substantially covering the break with solder. The manufacturing method further includes singulating the packages.

In an embodiment, a semiconductor package with a solder standoff is provided. The package includes a semiconductor die connected to a lead frame strip comprising a die pad and a plurality of lead pads. The package also includes a mold compound encapsulating the die but not the bottom surface of the lead pads or die pad. Further, the package has a solder standoff connected to each of the lead pads, the die pad, or the lead pads and the die pad, and the lead pads may extend to the edge of the package.

Also disclosed herein is a method for planarizing solder in a semiconductor package with a solder standoff including disposing solder on one of a lead pad, a die pad, or a lead pad and a die pad. The method also includes enclosing the solder between a planarization tool and at least one of the lead pad and die pad. The planarization tool comprises a device with a surface that promotes formation of a planar solder surface. A further step in the disclosed method includes reflowing the solder to create a substantially planar solder standoff. The method further includes removing the planarization tool without substantially altering the solder standoff.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

FIG. 3A illustrates a cross-sectional view of an encapsulated lead frame strip.

FIG. 3B illustrates a cross-sectional view of an encapsulated lead frame strip using a flip chip connection.

DETAILED DESCRIPTION

It should be understood at the outset that although exemplary implementations of embodiments of the present disclosure are illustrated below, the present system may be implemented using any number of techniques, whether currently known or in existence. The present disclosure should in no way be limited to the exemplary implementations, drawings, and techniques illustrated below, including the exemplary design and implementation illustrated and described herein, but may be modified within the scope of the appended claims along with their full scope of equivalents. Conventional manufacturing methods result in lead pads and solder standoffs having limited areas for connection to a larger electronic system. Specifically, the solder on the contacts is pulled back from the edge of the package. The pulled back configuration is required in conventional QFP package manufacturing so that the solder does not interfere with the singulation step. However, the pulled back configuration is problematic because it limits the extent to which the package footprint can be reduced. Therefore, it would be advantageous to have a semiconductor package with a solder standoff in which the lead pads extend to the edge of the package.

Figure 7A:
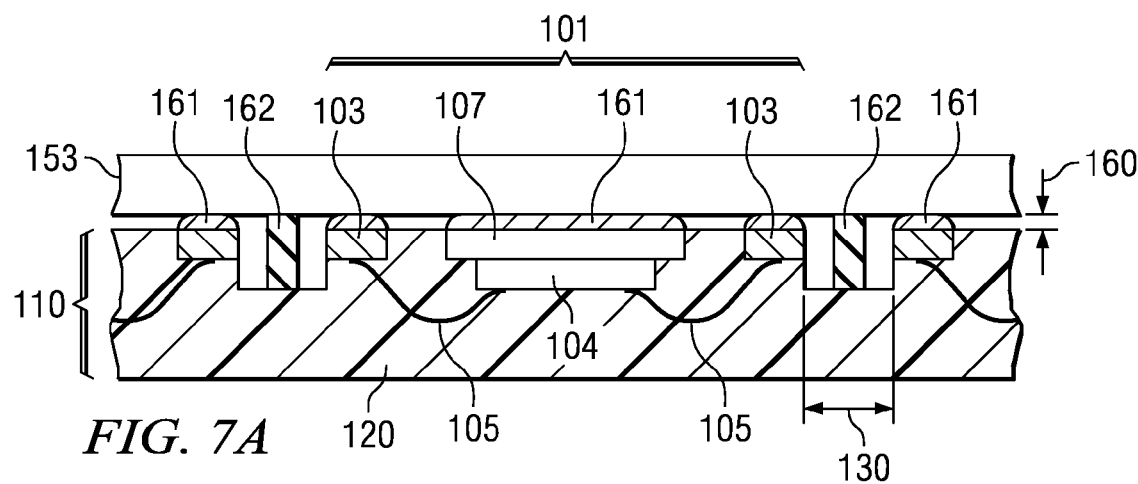
FIG. 7A illustrates a cross-sectional view of an encapsulated lead frame strip after solder reflow and prior to the planarization tool removal.
Figure 7B:
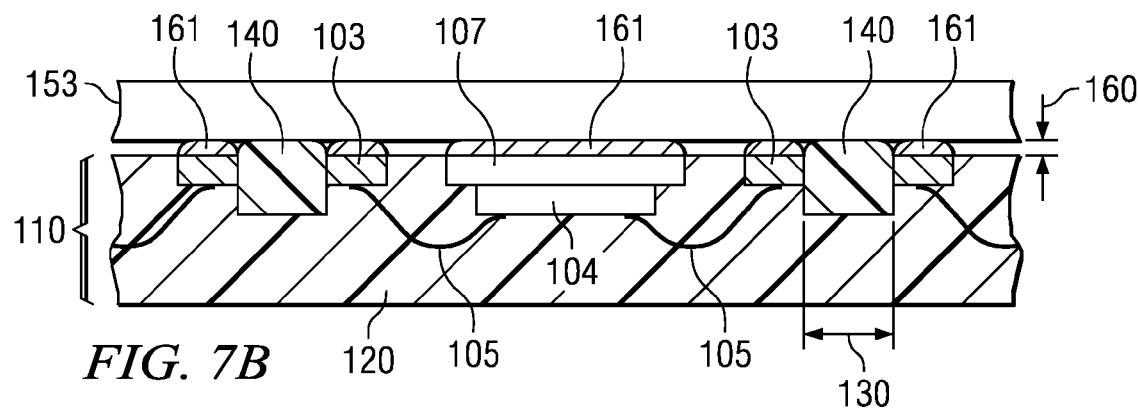
FIG. 7B illustrates an alternative cross-sectional view of an encapsulated lead frame strip after solder reflow and prior to the planarization tool removal.

In an embodiment shown in FIG. 7B, the disclosed method results in the production of an individual package 101 with a solder standoff 161 and lead pads 103 that extend to the edge of the package 101 without a pull-back. The lead pad 103 and the lead pad base metal may be exposed along the edge of the individual package 101. The solder standoff may be substantially planarized and the height 160 may be adjusted based on the spacer 162 height used and amount of solder. Further, the disclosed method may result in an individual package 101 that may be manufactured without an etching or plating line.

Figure 1A:
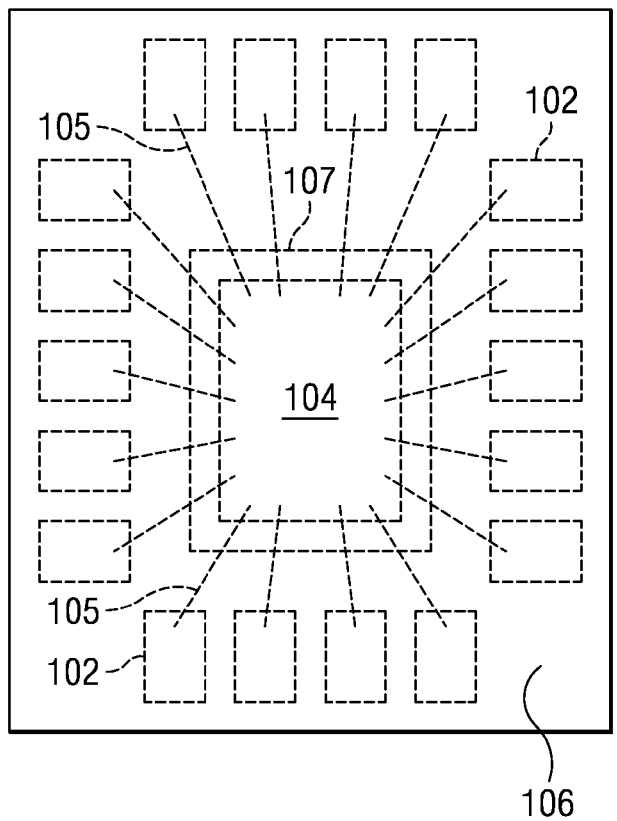
FIG. 1A illustrates a top view of a semiconductor package with a pulled back lead pad.
Figure 1B:
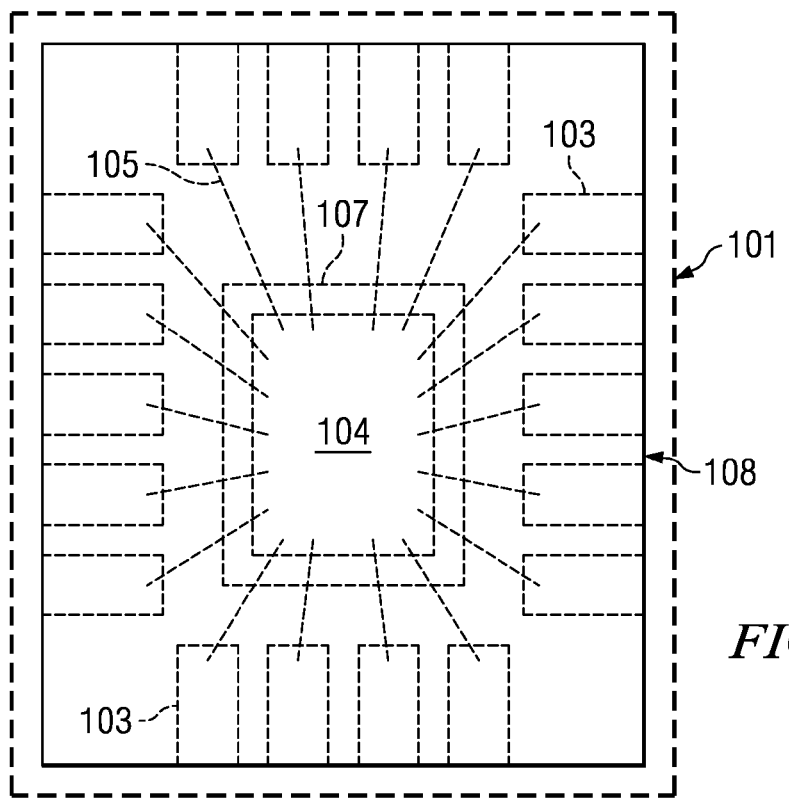
FIG. 1B illustrates a top view of a semiconductor package with a non-pulled back lead pad.

As shown in FIGS. 1A and 1B, the present disclosure contemplates a non-pulled back semiconductor package with a solder standoff and a method of manufacturing the same. FIG. 1A demonstrates a general package design with lead pads pulled back from the package edge 102, and FIG. 1B demonstrates an embodiment of the present disclosure in which the lead pads 103 extend to the edge of the package. The package 101 may be manufactured by cutting a channel between nearby packages on one side of a lead frame strip. The opposite side of the lead frame strip may have a semiconductor die 104 with associated electrical connections encapsulated in a mold compound. The channel between the packages may be filled with a solder resist prior to application of solder to the lead pads. A planarization tool may then be used to create a planar solder standoff on the lead frame strip. Finally, the packages may be singulated to create non-pulled back packages 101. Further, the disclosed method produces the disclosed package without the need for etching or plating.

Figure 2:
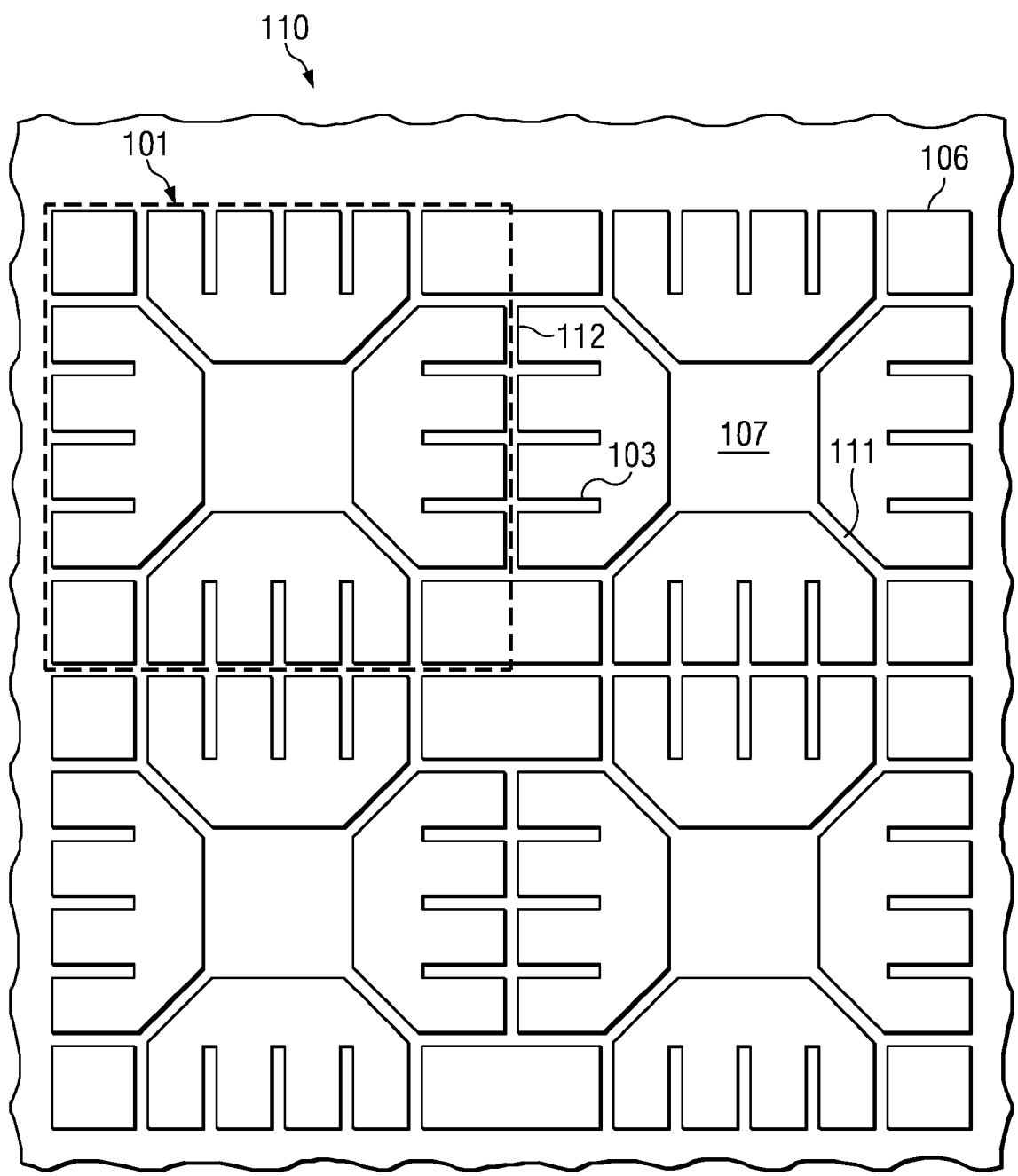
FIG. 2 illustrates a top view of a lead frame strip.

As shown in FIG. 2, a package 101 may be manufactured using a lead frame strip 110 containing a plurality of potential packages 101. The lead frame strip 110 may have a sheet like structure comprising a base material such as copper and an optional protective layer that may include nickel, gold, palladium, tin, or bismuth. The lead frame strip 110 may be rigid or flexible and may comprise a long single piece that may have two areas including a plurality of die pads 107 and associated lead frame lead pads 103. In order to facilitate the production process, the lead frame strip 110 may also include pilot holes (not shown) to facilitate alignment between various processes and tie bars 111 to secure the die pad 107 to the package 101 frame. Side rails (not shown) serve as an outer support and contain the pilot holes. The lead frame strip 110 may also have dam bars 112 linking nearby packages 101 by connecting the lead pads 103 of nearby packages 101. The outermost package 101 in the lead frame strip 110 is surrounded by dam bars 112 between nearby packages 101 and side rails on the outside edges. In an embodiment, a lead frame strip 110 may have, for example, between 16 and over 8000 packages 101. A typical package 101 may be between 1.0 mm wide by 1.0 mm long and 15 mm wide by 15 mm long. The package 101 may have, for example, between 4 and 128 lead pads 103.

FIG. 3A illustrates one embodiment of a cross-sectional view of an encapsulated lead frame strip in which a semiconductor die 104 is mounted on a die pad 107. In this embodiment, a package 101 comprises a die pad 107 and a plurality of lead pads 103 surrounding the die pad 107. The die 104 may be attached to a first surface of the die pad 107 using a die attach material. The die attach material may be either an insulating or conductive material. If the die pad 107 under the die 104 is used as a ground connection, then the die attach material may need to be electrically conductive. Thermally conductive material may also be useful if the die pad 107 is used as a heat sink for the die 104. In an embodiment, a die attach material may be an epoxy such as a silver epoxy disposed on the die pad 107 prior to the attachment of the die 104. The die pad 107 may be located near the center of the package 101 on the lead frame strip 110. In some embodiments, a package 101 may have a plurality of die 104 attached to a plurality of die pads 107 or arranged in a stacked configuration.

In an embodiment as shown in FIG. 3A, the die 104 may be electrically connected to the lead pads 103 of the associated package 101 on the lead frame strip 110. In an embodiment, a die 104 may be electrically connected to the lead pads 103 using bond wires 105. The wires 105 may be formed by wire bonding and may include materials such as gold, aluminum, copper, or other materials. After encapsulation, the bond wires 105 provide the electrical connection between the lead pads 103 and the die 104. In an alternative embodiment shown in FIG. 3B, a flip-chip process may be used to electrically connect the die 104 to the lead pads 103. In this embodiment, the bonding pads on the die 104 are directly connected with the lead pads 103 on the first surface of the lead frame strip 110 using a suitable process that may include direct solder ball bumping, or any other method that creates a direct solder connection 121. The use of a flip chip connection or a wire bonded connection may result in a functionally equivalent package 101 after encapsulation of the first lead frame surface, and both are intended to be within the scope of this disclosure.

The die side of the lead frame strip may be encapsulated in a mold compound 120. A mold containing the lead frame strip 110 and mold compound 120 may be used to form a plurality of molded packages 101. In an embodiment, the mold compound 120 may include epoxy resins, ceramics, phenolic hardeners, silicas, catalysts, pigments, mold release agents, or other compounds. After encapsulation, only the second surface of the die pad 107 and lead pads 103 may be exposed. In a subsequent step the individual packaged units will be separated from each other (i.e. singulated) by cutting along the dambars 112, either by sawing or by punching out the individual units. The exposed die pad 107 and lead pads 103 on the second surface of the lead frame strip 110 may then be used to electrically connect the package 101 to an external electronic system.

Figure 4A:
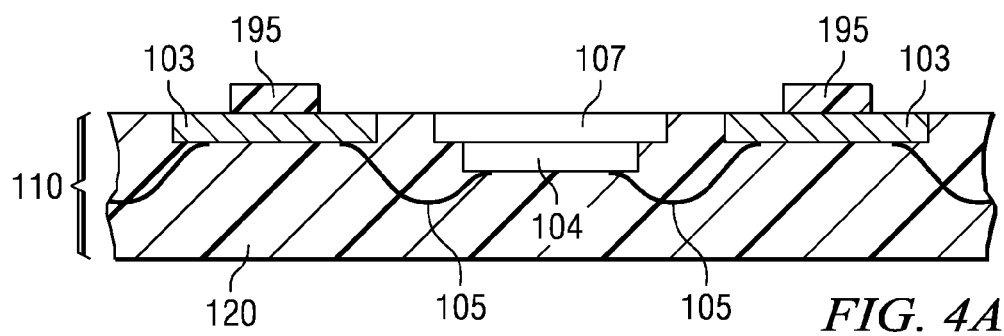
FIG. 4A illustrates a cross-sectional view of an encapsulated lead frame strip with a mask.

As shown in FIG. 4A, in an embodiment a pattern of resist may be positioned over the dambars 112. Solder may then be disposed as described below prior to singulation.

Figure 4B:
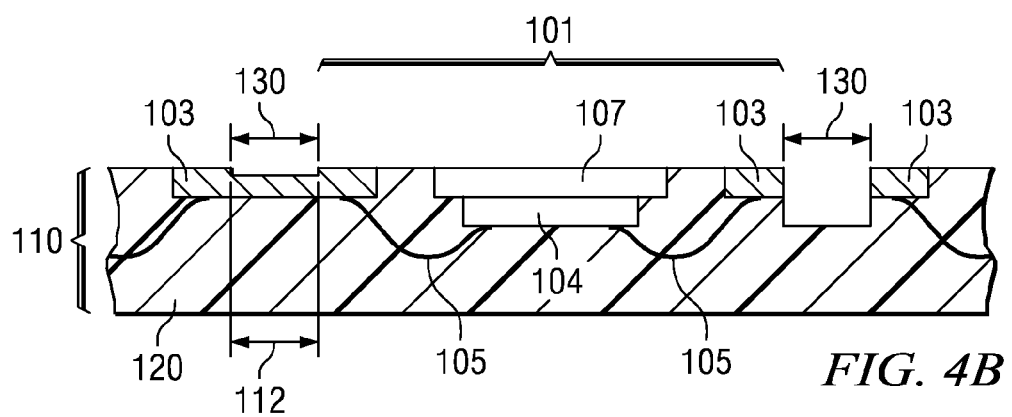
FIG. 4B illustrates a cross-sectional view of an encapsulated lead frame strip with a channel.

In another embodiment, as shown in FIG. 4B, a cutting device may be used to form a channel 130 between the lead pads 103 of nearby packages 101 on the lead frame strip 110. Any device capable of cutting a channel 130 along the dam bars 112 between the packages 101 may be used, several of which are known to one skilled in the arts. An example of a cutting device may be a saw, punch, laser, or chemical etch. The channel 130 between the packages 101 is not intended to singulate the individual packages 101. Rather, the channel 130 may extend through the dam bars 112 and into the mold compound 120 or may extend only partially through the dam bars 112.

As shown in FIG. 5, the channel 130 may be filled with a removable and heat resistant material. In an embodiment, the removable, heat resistant material is a resin or solder resist 140. A solder resist 140 may comprise a removable, heat resistant, low surface tension, non-wetting material, which prevents wicking of the solder around the lead pad edge 108. As used herein, the phrase lead pad edge 108 is intended to refer to the portion of the lead pad 103 exposed along the side of an individual package 101, and the term wicking is intended to refer to a fluid flow in response to a capillary force, a gravitational force, a differential pressure, or a combination thereof. In an embodiment, the solder resist 140 may comprise a photoimageable dielectric material, such as a negative or positive tone resist.

Figure 5A:
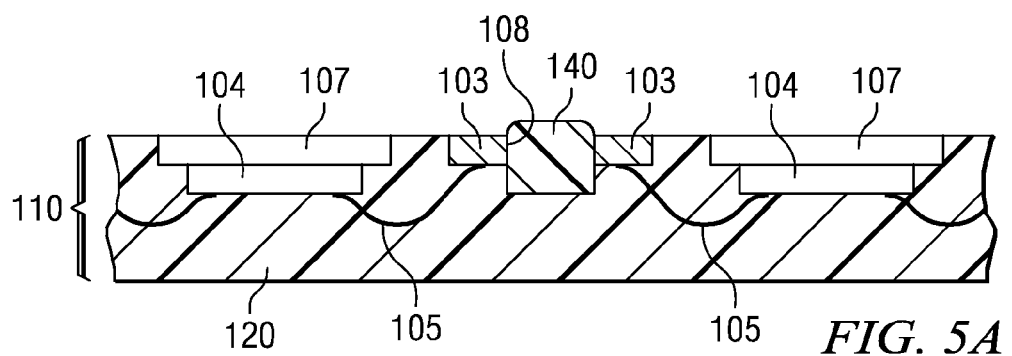
FIG. 5A illustrates a cross-sectional view of an encapsulated lead frame strip with a full channel and resin fill.
Figure 5B:
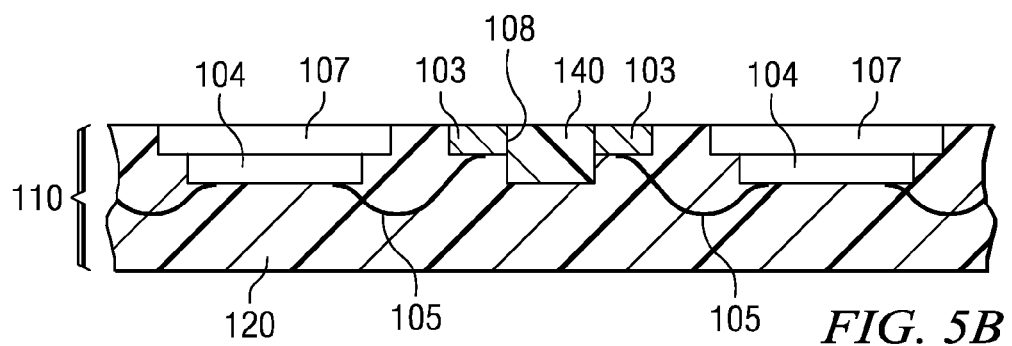
FIG. 5B illustrates a cross-sectional view of an encapsulated lead frame strip with a full channel and an alternative resin fill.
Figure 5C:
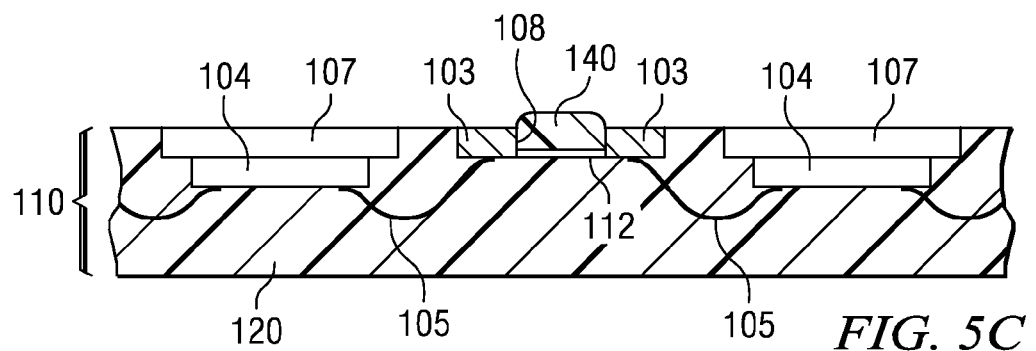
FIG. 5C illustrates a cross-sectional view of an encapsulated lead frame strip with a shallow channel and an alternative resin fill.
Figure 5D:
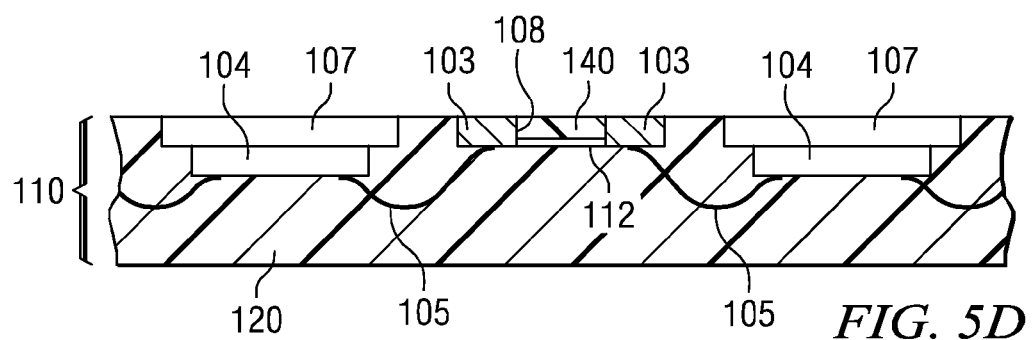
FIG. 5D illustrates a cross-sectional view of an encapsulated lead frame strip with a shallow channel and an alternative resin fill.

The channels 130 may optionally be filled with solder resist 140 to a level even with the nearby lead frame strip 110 surface or to a level extending beyond the lead frame strip 110 surface. In an embodiment in which the dam bars 112 are only partially cut, a solder resist fill 140 may be desirable to prevent solder from entering the channel 130. As shown in FIGS. 5B and 5D, the channel 130 may be filled even with the surrounding lead frame strip 110 surface to prevent solder from attaching to the channel 130 during solder application and reflow. Alternatively as shown in FIGS. 5A and 5C, the solder resist 140 may extend beyond the surrounding lead frame strip 110 surface level. The height of the solder resist 140 may depend on the processing needs during planarization or the final solder standoff height 160 requirements. A channel 130 filled with solder resist 140 that extends beyond the lead frame strip 110 surface level may also be used as a spacer during planarization 106, as discussed below.

In an embodiment shown in FIG. 6, solder may be disposed on a lead pad 103, die pad 107, or both. In general, an electrical or mechanical connection to both a die pad 107 and a lead pad 103 may be used in a package 101. Thus, the term pad or pads when used alone is intended to refer to both the die pad 107 and the lead pad 103. The solder may comprise any conductive metal or metals capable of being melted and wetting a pad surface to form a mechanical and electrical connection with the pad. For example, the solder may include a lead-free solder such as a compound comprising tin, silver, copper, or a combination thereof. The disclosed method may allow the solder composition to be changed by altering the solder makeup prior to disposition on the pad surface. In general, the change in composition would not require a change in chemical solutions as would be required in an etching and plating process.

Figure 6A:
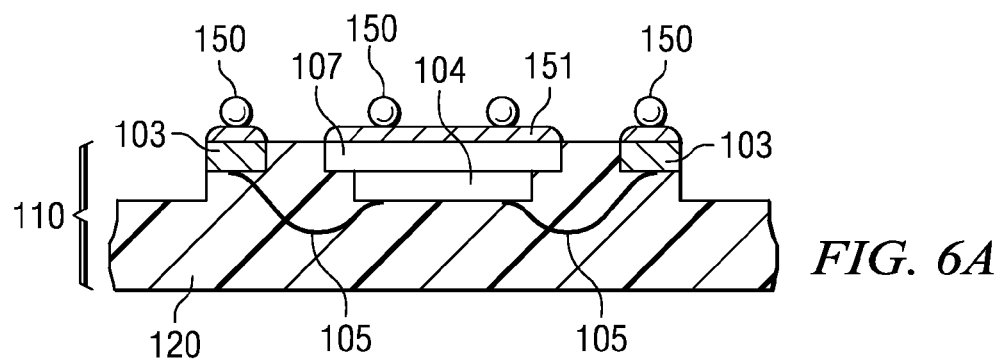
FIG. 6A illustrates a cross-sectional view of an encapsulated lead frame strip with flux and solder balls disposed on the surface.
Figure 6B:
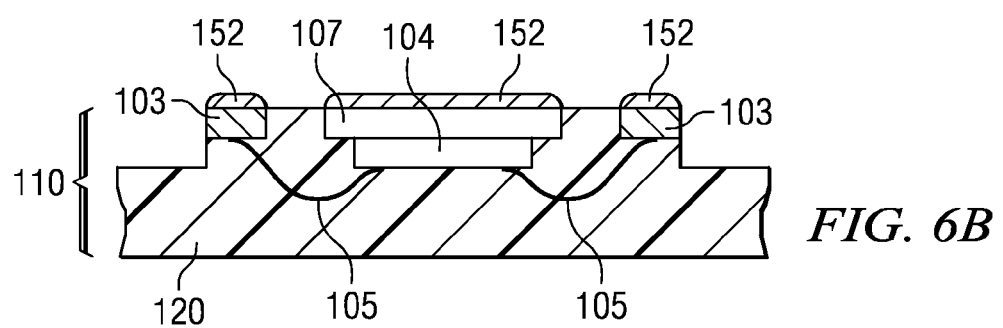
FIG. 6B illustrates a cross-sectional view of an encapsulated lead frame strip with solder paste disposed on the surface.
Figure 6C:
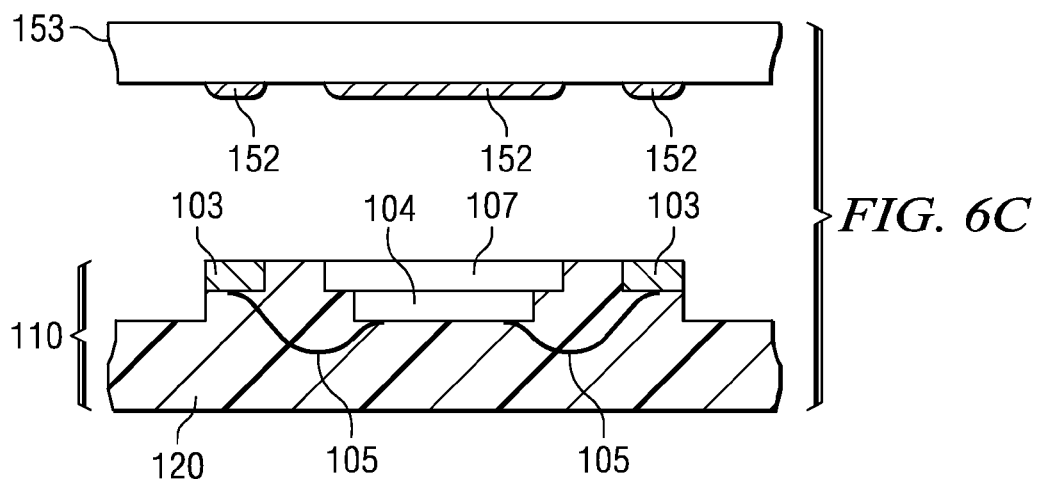
FIG. 6C illustrates a cross-sectional view of an encapsulated lead frame strip with solder paste disposed on a planarization tool.

FIGS. 6A, 6B, and 6C illustrate various configurations of disposed solder on the package 101. In an embodiment, the solder may be in the form of a solder ball 150 or solder paste 152. Solder balls 150 may be formed in a separate process and then placed upon the pads. The solder balls 150 may be secured to the pads using a tacky or sticky flux 151 capable of holding the solder ball 150 to the pads during subsequent processing steps. The flux 151 may comprise a fluid having constituents such as an adhesion-imparting agent for cleaning the surface of the pad, a thixotropic agent to provide solder powder separation, a solvent for paste formation, and an activator for removing oxides off the surface of the pad. In an alternative embodiment, solder paste 152 may be screen printed on the pads. The solder paste may include solder powder mixed with solder flux 151. Alternatively, the solder paste 152 may be applied on a planarization tool 153, as discussed below.

In an embodiment shown in FIGS. 7A and 7B, a planarization tool 153 is used to ensure that the surfaces of the solder standoffs 161 on the package 101 are uniform. In a package 101, the substrate or lead frame strip 110 may be slightly warped or uneven. Planarization of the solder standoffs 161 may compensate for the unevenness and provide a planar surface for connection to a larger electronic system. Further, the solder would form a rounded surface during reflow due to surface tension forces without a mechanical forming of the molten solder.

The planarization tool 153 may comprise a device with a planar surface capable of providing a reference plane to which the solder standoff 161 surfaces will be matched. In an embodiment, the surface of the planarization tool 153 may comprise a non-wetting surface with solder such as ceramic or titanium. The planarization tool 153 may comprise any heat resistant material having a thermal expansion rate comparable to that of the mold compound 120, lead frame strip 110 or both. A single planarization tool 153 may be used for an entire lead frame strip 110 and sized according to the lead frame strip dimensions.

As shown in FIGS. 7A and 7B, a spacer 162 may optionally be used between the planarization tool 153 and the lead frame strip 110 surface to determine the final solder standoff height 160 and help to planarize and level the lead frame strip 110 during planarization of the solder. In an embodiment, a spacer 162 is required if the weight of the planarization tool 153 when placed on top of the solder and lead frame strip 110 would displace the solder beyond the edge of a pad during solder reflow. A spacer 162 may be needed to set the distance between the planarization tool 153 and the lead frame strip 110 to determine the final solder standoff height 160. In an embodiment, the solder standoff height 160 may be less than 5 mm, alternatively less than 1 mm. A spacer 162 may be a part of the planarization tool 153 and placed on the lead frame strip 110 at the same time as the planarization tool 153. In this embodiment, solder paste 152 may not be disposed on the surface of the planarization tool 153 due to interference from the spacer 162 with the screen printing process. Alternatively, the spacer 162 may be separate from the planarization tool 153. In this embodiment, the spacer or spacers 162 may be placed at the appropriate points on the lead frame strip 110 prior to placement of the planarization tool 153. The planarization tool 153 may then be placed so that it will rest on the spacers 162 prior to or during reflow of the solder. In another embodiment, the solder resist fill 140 in the channel 130 between nearby packages 101 may act as a spacer 162. During reflow, the planarization tool 153 may then form a planar solder surface at the level of the solder resist fill 140. In this embodiment, a typical solder resist 140 may extend perpendicularly beyond the surface of the lead frame strip 110 less than 5 mm, alternatively less than 1 mm.

The spacers 162 may be located so as to not interfere with the solder or damage the package 101 during solder reflow or processing. Any location that would not interfere with the formation of planar solder surface on the lead pads 103 or die pad 107 of a package 101 may be used as a spacer placement location. In an embodiment, the spacers 162 may be placed at the corners of the packages 101. Typically, the corners of the packages 101 may be unused due to an arrangement in which the lead pads 103 extend to the edge of the package 101. The spacers 162 may therefore be placed at the package corners without interfering with a pad or risking damage to a package 101. Alternatively, the spacers 162 may be placed in the channels 130 or spaces between nearby packages 101. In this embodiment, the spacers 162 may avoid interfering with the lead pads 103 during reflow and may also function to prevent solder from wicking into the channel 130 between the packages 101.

Figure 8:
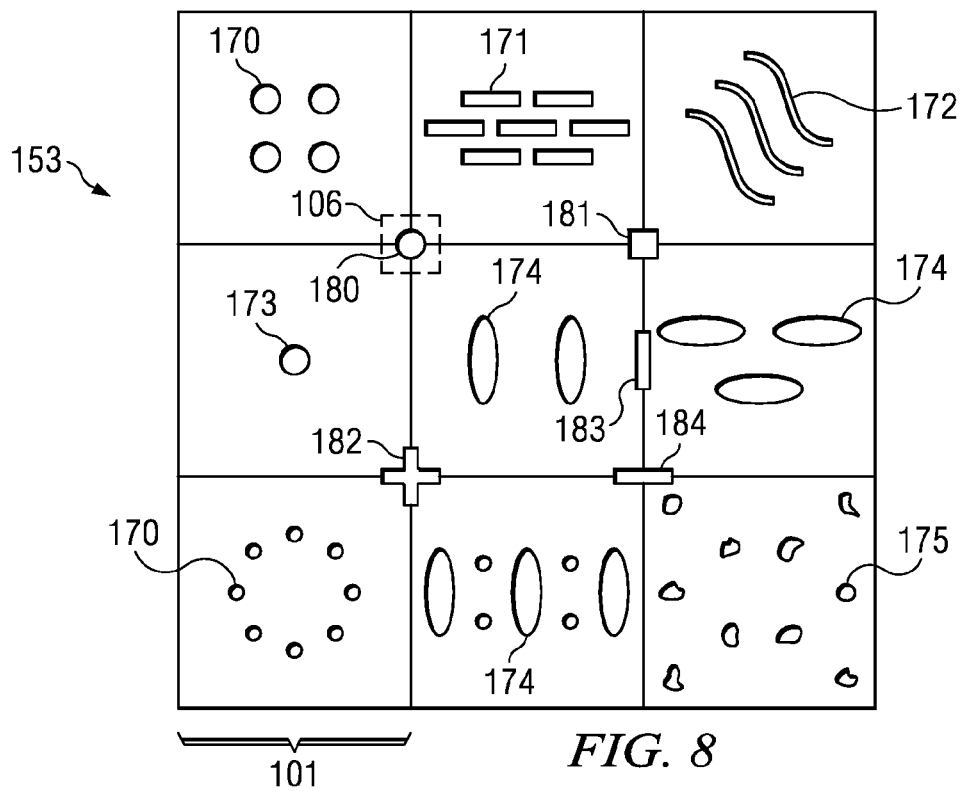
FIG. 8 illustrates a plan view of various planarization tool pore designs and spacer designs.

As shown in FIG. 8, the spacers 162 may be shaped and placed in a number sufficient to support the planarization tool 153 while not interfering with the formation of a planar solder surface on the pads. The spacers 162 may comprise a pillar like structure with a circular 180, square 181, or rectangular 184 cross-section. Alternatively, the spacer 162 may comprise a shape resembling a wall 183 or a combination of wall shapes forming a cross 182. The number of spacers 162 used may depend on a number of factors including, but not limited to, the type of spacers 162 used, the spacer design, the lead frame strip 110 design, and the final solder standoff height 160 required. For example, the spacers 162 may be placed along every package 101 edge if the solder resist 140 serves as the spacer 162. Alternatively, the spacers 162 may be placed at the corner or edge of packages 101 throughout the lead frame strip in a number sufficient to support the planarization tool 153 and level the lead frame strip 110, but not necessarily at every corner or edge.

As shown in FIG. 8, the planarization tool 153 may optionally comprise pores or be formed from a porous material to allow for gas to escape during reflow of the solder. During reflow, the flux 151 may vaporize or emit gas. If the gas is trapped by a planarization tool 153, the solder may flow beyond the pad surface, for example into the channel 130 between the nearby packages 101 on the lead frame strip 110, or may form voids in the solder, which may result in poor connectivity with the lead pad 103. Pores or a porous material may be used to allow the gas to escape during the reflow process. The pores may have any shape and be present in any number sufficient to allow any gas resulting from the reflow of the solder to escape. In an embodiment, the pores may comprise an array of small diameter circles 170, squares 171, ovals 174, or slits 172 in the planarization tool 153. Alternatively, the pores may comprise an irregular array of small diameter circles 175, squares or slits that may be concentrated near the center 173 of each package 101 or distributed over the planarization tool 153. In an embodiment, the circular pore diameter or non-circular pore width may range from 0.01 mm to 5 mm. Alternatively, the planarization tool 153 may comprise a porous material capable of allowing a gas to flow through the planarization tool 153 at a rate sufficient to remove the solder flux offgas and prevent voids from forming in the solder standoff 161. For example, a porous ceramic material may be used to form the planarization tool 153 surface.

Figure 9:
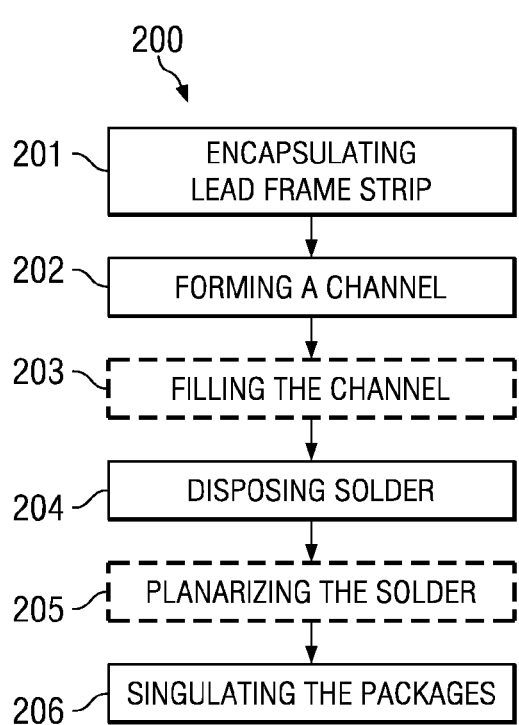
FIG. 9 is a flow diagram of a method of fabricating a semiconductor package with a solder standoff.

A method 200 of manufacturing a non-pulled back package with a solder standoff is shown in FIG. 9. The steps of the disclosed method may be performed in any order capable of producing the desired result. However, one possible order in which the steps of the disclosed method may be carried out is described herein. The disclosed method may comprise encapsulating the lead frame strip with a mold compound 201 and forming a channel between nearby package sites 202 on the lead frame strip. The channel may then be optionally filled with a resin 203. Solder may then be disposed on the surface of the lead pads, die pad or both 204. The solder may then optionally be reflowed or planarized using a planarization tool 205. A washing step may optionally follow the reflow or planarization process to remove any residual flux or resin. Finally, the individual package sites on the lead frame strip may be singulated 206 to form individual non-pulled back packages.

In method 200, the lead frame strip may be encapsulated using a mold compound 201. Prior to encapsulation, the lead frame strip 110 may have a die 104 mounted to a die pad 107 on the lead frame strip 110 as shown in an embodiment shown in FIG. 3A. The die 104 may be mechanically connected to the lead frame strip 110 using a die attach material. The die may then be electrically coupled to the lead frame strip using any means capable of creating the electrical coupling, several of which are known to one skilled in the arts and have been disclosed above. A mold may be used to enclose the lead frame strip 110 containing the die 104 and form the mold compound 120. In an embodiment, the lead frame strip 110 may comprise a plurality of packages 101, which in turn may comprise a plurality of die pads 107. The mold compound 120 may be formed by thermal compression to form a mold encapsulating the die pads 107, the die 104, the electrical connections, and one surface of the lead pads 103. After encapsulation 201, the die pad 107 and lead pads 103 may be exposed on one side of the lead frame strip 110, which is usually the side opposite the side on which the die 104 was mounted.

Method 200 may comprise forming 202 a channel 130 between nearby packages 101 on the lead frame strip 110, resulting in an embodiment shown in FIG. 4. The channel 130 may be created using any method capable of cutting the encapsulated lead frame strip 110, as would be known to one skilled in the arts. Possible methods of creating the channel 130 may include without limitation the use of a saw, laser, or chemical etch. As discussed above, the channel 130 may extend through the lead frame strip 110 and into the mold compound 120 without singulating the packages 101 or may extend only partially through the lead frame strip 110.

Method 200 may optionally comprise filling 203 the channel 130 with a removable, heat resistant material resulting in an embodiment shown in FIG. 5A, 5B, 5C, or 5D. In an embodiment, the removable, heat resistant material is a resin or a solder resist 140. The solder resist 140 may be deposited through a blanket deposition on the encapsulated lead frame strip 110 second surface, substantially covering the surface. The deposition may be accomplished using a suitable process such as spraying the solder resist 140 with a nozzle or moving the lead frame strip 110 through a curtain of solder resist 140. Following deposition, the solder resist 140 may be partially hardened using a suitable curing process. An example of a curing process may include baking. The solder resist 140 may then be exposed to a pattern of radiation, for example, through the use of a mask. Following exposure of the solder resist, a development step, which may remove the unexposed portions, may be performed using a suitable development process including exposure to a developing agent such as sodium monohydrate or potassium carbonate monohydrate. Following development, the solder resist 140 may be rinsed, dried, and cured. Alternatively, the solder resist 140 may be selectively placed in the channels 130 between the packages 101. A curing process may then be used to fix the solder resist 140 in the channels.

In method 200, solder may then be disposed on the exposed surface of the die pad, lead pads or both 204, resulting in an embodiment shown in FIG. 6A, 6B, or 6C. Any method that is capable of disposing solder on the pads may be used. In an embodiment, the solder is in the form of a solder ball 150 disposed on the pad surface using a flux 151. The flux 151 may be applied to the pads using a spraying or rolling procedure followed by placement of the solder balls 150. Alternatively, the flux 151 may be applied to the solder balls 150 which may subsequently be placed on the pads. One or more solder balls 150 may be placed on the lead pads 103 or die pad 107 depending on a variety of considerations including, but not limited to, the pad size, the solder ball size, and the final solder standoff height requirement. Alternatively, solder may be disposed in the form of a solder paste 152. A screen printing process may be used to dispose the solder paste 152 on the surface of the lead frame strip 110, after which the solder paste 152 may be capable of remaining on the pad until being fixed in a subsequent reflow or planarization process. In another embodiment, a solder paste may be applied to the pads using a planarization tool 153 having the solder paste screen printed on its surface. The planarization tool 153 may then be aligned and placed on the lead frame strip 110 such that the solder is disposed on a pad surface along with the planarization tool 153.

If a solder is disposed on the surface of the lead frame strip 110 using a solder paste 152 and screening process, the solder may be held back from the edge of the pads as shown in FIGS. 6B and 6C. The holdback may help prevent solder from wicking around the edge of the pad or from bridging between nearby pads, which may create electrical shorts and failures in the package. Withholding solder from the edge of the pad may be important when the channel 130 between nearby packages 101 is not filled with solder resist 140 as it may reduce the amount of solder that flows into the channel 130. A reduction in the amount of solder located in the channel 130 may decrease the amount of material that must be removed in a singulation step and prolong the operational life of the singulation device.

In method 200, the disposed solder may optionally be planarized 205. In an embodiment, a planarization tool 153 of the disclosed design may be used to planarize the solder on the pad surfaces. A method of planarizing the disposed solder using the planarization tool is disclosed below in method 300. If the disposed solder is not planarized, a solder reflow process, as discussed below, may be used to bond the solder to the pad surface.

In an embodiment, the lead frame strip 110 may optionally be washed after the reflow process to remove any solder resist 140 or residual flux 151. Any washing or cleaning process capable of removing residual flux 151 or solder resist 140 may be used and would be known to one skilled in the arts. Washing may remove the solder resist 140 from the channel 130 between the packages 101. As a result, singulation of the packages 107 would only require cutting through the remaining dam bar 112 metal and mold compound which may increase the performance and operational life of a device used to singulate the packages 101.

Method 200 may comprise singulating 206 the lead frame strips 110 to form individual packages 101. Singulation refers to the process whereby the connecting material between nearby packages 101 in a lead frame strip 110 is removed or separated so as to create individual packages 101. Any method capable of singulating the lead frame strip 110 may be used and would be known to one skilled in the arts. Examples of singulation techniques include sawing or punching. In an embodiment, the packages 101 may be singulated using a saw. The saw may be of the same thickness as the saw used to cut the channels 130 between the packages 101. Alternatively, the saw may be slightly thinner allowing for some variance in the cutting lane between the packages 101. A thinner saw may also avoid smearing of the lead pad metal or solder along the lead pad edge 108, which could lead to an electrical short between nearby pads during operation. The singulation of the packages 101 results in the lead pad edge 108 exposed on the side of the individual package 101.

Figure 10:
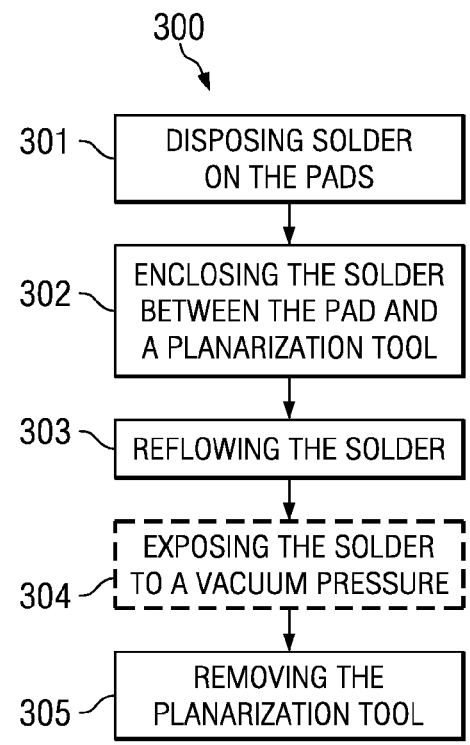
FIG. 10 is a flow diagram of a method of planarizing solder in a semiconductor package with a solder standoff.

As described in method 300 in FIG. 10, the solder may be planarized to ensure a relatively flat surface for bonding to an external electronic system once the solder is disposed on the surface of a lead pad or die pad. Once the solder has been disposed 201 on the surface of the lead frame strip 110 as shown in FIG. 7, the planarization tool 153 may be placed on the lead frame strip 110, enclosing the solder between the two surfaces 202. The pilot holes in the lead frame strip 110 may be used to align the planarization tool 153 with the lead frame strip 110. During the planarization process, the lead frame strip 110 may be oriented such that the encapsulated side is under the surface with the disposed solder and planarization tool on top. Spacers 162 may be used to hold the planarization tool 153 at a required distance from the lead frame strip 110, or the planarization tool 153 may be placed on the disposed solder without any support.

In method 300, the solder, which is enclosed between the lead frame strip 110 and the planarization tool 153, may then be subjected to a reflow process 303 carried out in a reflow oven. The oven heats the solder above the solder melting point so that the solder flows. Since the molten solder is in contact with a planar surface, it may assume the shape of the planarization tool 153 rather than form a humped or rounded surface. For lead frame strips 110 using a solder resist fill 140 in the channel 130 between the packages 101, the solder resist 140 fill may act as barrier to prevent solder from flowing into the channel 130. Alternatively, a lead frame strip 110 having an empty channel 130 may control the amount of disposed solder and final solder standoff height 160 in order to reduce or prevent any solder from flowing into the channel 130. Referring to method 300, the package comprising the lead frame strip 110, solder, and planarization tool 153 may optionally be exposed to a vacuum pressure 304 while the solder is molten to increase the flux off-gassing and reduce the occurrence of voids in the finished solder surface. In this embodiment, the solder may be exposed to a vacuum pressure ranging from 0 psia to 14 psia.

As shown in method 300, the planarization tool 153 may be removed 305 from the solder surface as the solder cools. If the solder is allowed to cool completely, removal of the planarization tool 153 may cause the mechanical bond between the solder and a pad to fail. Therefore, the planarization tool 153 may be removed once the solder has solidified but before the solder has cooled sufficiently to bond to the pad or planarization tool 153. Some surface voids on the solder standoff 161 may result from the planarization of the solder, but the voids may not affect the solder standoff's 161 ability to attach to an end product or larger electronic system. After removal, the planarization tool 153 may optionally be washed or cleaned prior to reuse to remove any solder or flux residue remaining after the reflow process. A method of removing solder or flux residue would be known to one skilled in the arts.

In an embodiment as shown in FIG. 1B, the disclosed method results in the creation of an individual package 101 with a solder standoff 161 and lead pads 103 that extend to the edge of the package 101 without a pull-back. The lead pad 103 and lead pad base metal may be exposed along the edge of the individual package 101. The solder standoff 161 may be substantially planarized and the height 160 may be adjusted based on the spacer 162 height used. Further the individual package 101 may comprise a die 104 that is electrically connected to the lead pads 103 using a variety of connection techniques including, but not limited to, wire bonding and a flip chip process. The individual package 101 may be encapsulated in any mold compound 120 capable of encapsulating the package 101 and may comprise any lead frame strip material, design, or pattern capable of passing through the disclosed manufacturing method. The disclosed method may result in an individual package 101 that may be manufactured without an etching or plating line.

This disclosure describes a method for manufacturing a semiconductor package. While the described method results in a package without a lead, the method could be expanded to include the additional step of connecting a lead to the lead pad with a raised solder surface. The lead could then be used in conjunction with the associated raised solder surface to allow the package to be connected to a larger electronic system. Since the main manufacturing method steps are the same, both a leadless and leaded package are considered to be within the scope of this disclosure.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein, but may be modified within the scope of the appended claims along with their full scope of equivalents. For example, the various elements or components may be combined or integrated in another system or certain features may be omitted, or not implemented.

Also, techniques, systems, subsystems and methods described and illustrated in the various embodiments as discrete or separate may be combined or integrated with other systems, modules, techniques, or methods without departing from the scope of the present disclosure. Other items shown or discussed as directly coupled or communicating with each other may be coupled through some interface or device, such that the items may no longer be considered directly coupled to each other but may still be indirectly coupled and in communication, whether electrically, mechanically, or otherwise with one another. Other examples of changes, substitutions, and alterations are ascertainable by one skilled in the art and could be made without departing from the spirit and scope disclosed herein.

What is claimed is:

1. A method of assembling a QFN package on a printed circuit board, comprising:

providing a QFN package having a die pad and leads exposed from a mold compound, the die pad and leads covered with solder standoff having a planarized flat surface, wherein a plurality of lead pads with solder standoff extend to an edge of the package without pullback;

placing the QFN package to a printed circuit board; and melting the solder to join the QFN package and the printed circuit board.

2. The method of claim 1, in which the planarized solder surface is formed by a process of reflowing a solder material disposed on the die pad and on the leads between a planarizing tool and the die pad.

3. The method of claim 2, in which the reflowing the solder material is under reduced atmosphere.

4. The method of claim 2, in which the planarization tool includes a spacer for setting a solder standoff height.

5. The method of claim 2, in which the planarization tool includes pores.

6. The method of claim 1, in which each lead has a solder-free surface exposed from the mold compound.

7. The method of claim 6, in which the mold compound adjacent the solder-free lead surface has a ledge.

8. The method of claim 7, in which the ledge is formed by a two step sawing process.

\* \* \* \* \*